United States Patent
Huang et al.

(10) Patent No.: US 10,361,113 B2
(45) Date of Patent: Jul. 23, 2019

(54) FORMATION AND IN-SITU TREATMENT PROCESSES FOR GAP FILL LAYERS

(71) Applicant: Taiwan Semiconductor Manufacturing Co., Ltd., Hsinchu (TW)

(72) Inventors: Jian-Shiou Huang, Pingtung County (TW); Bang-Tai Tang, New Taipei (TW); Chih-Tang Peng, Hsinchu County (TW); Tai-Chun Huang, Hsinchu (TW); Yen-Chun Huang, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/876,583

(22) Filed: Jan. 22, 2018

(65) Prior Publication Data
US 2019/0006228 A1 Jan. 3, 2019

Related U.S. Application Data

(60) Provisional application No. 62/527,648, filed on Jun. 30, 2017.

(51) Int. Cl.
| *H01L 21/469* | (2006.01) |
| *H01L 21/762* | (2006.01) |
| *H01L 21/02* | (2006.01) |
| *H01L 21/8234* | (2006.01) |

(52) U.S. Cl.
CPC .... *H01L 21/76224* (2013.01); *H01L 21/0217* (2013.01); *H01L 21/0228* (2013.01); *H01L 21/0234* (2013.01); *H01L 21/02219* (2013.01); *H01L 21/02222* (2013.01); *H01L 21/02271* (2013.01); *H01L 21/02274* (2013.01); *H01L 21/02329* (2013.01); *H01L 21/823431* (2013.01); *H01L 21/823481* (2013.01); *H01L 21/823437* (2013.01)

(58) Field of Classification Search
CPC .......... H01L 21/76224; H01L 21/0217; H01L 21/02274; H01L 21/28556; H01L 21/0228; H01L 21/02315; H01L 21/0234
See application file for complete search history.

(56) References Cited

U.S. PATENT DOCUMENTS

| 9,184,089 B2 * | 11/2015 | Tsai | H01L 21/76224 |
| 9,331,074 B1 * | 5/2016 | Chang | H01L 27/0886 |
| 2018/0040510 A1 * | 2/2018 | Briggs | H01L 21/76897 |

* cited by examiner

*Primary Examiner* — Hsien Ming Lee
(74) *Attorney, Agent, or Firm* — Sterne, Kessler, Goldstein & Fox P.L.L.C.

(57) ABSTRACT

The present disclosure relates to a semiconductor device and a manufacturing method, and more particularly to a semiconductor device having an enhanced gap fill layer in trenches. The present disclosure provides a novel gap fill layer formed using a multi-step deposition and in-situ treatment process. The deposition process can be a flowable chemical vapor deposition (FCVD) utilizing one or more assist gases and molecules of low reactive sticking coefficient (RSC). The treatment process can be an in-situ process after the deposition process and includes exposing the deposited gap fill layer to plasma activated assist gas. The assist gas can be formed of ammonia. The low RSC molecule can be formed of trisilylamin (TSA) or perhydropolysilazane (PHPS).

20 Claims, 10 Drawing Sheets

US 10,361,113 B2

FORMATION AND IN-SITU TREATMENT PROCESSES FOR GAP FILL LAYERS

This application claims the benefit of U.S. Provisional Patent Application No. 62/527,648, titled "Formation and In-situ Treatment Processes for Gap Fill Layers," which was filed on Jun. 30, 2017 and is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1:
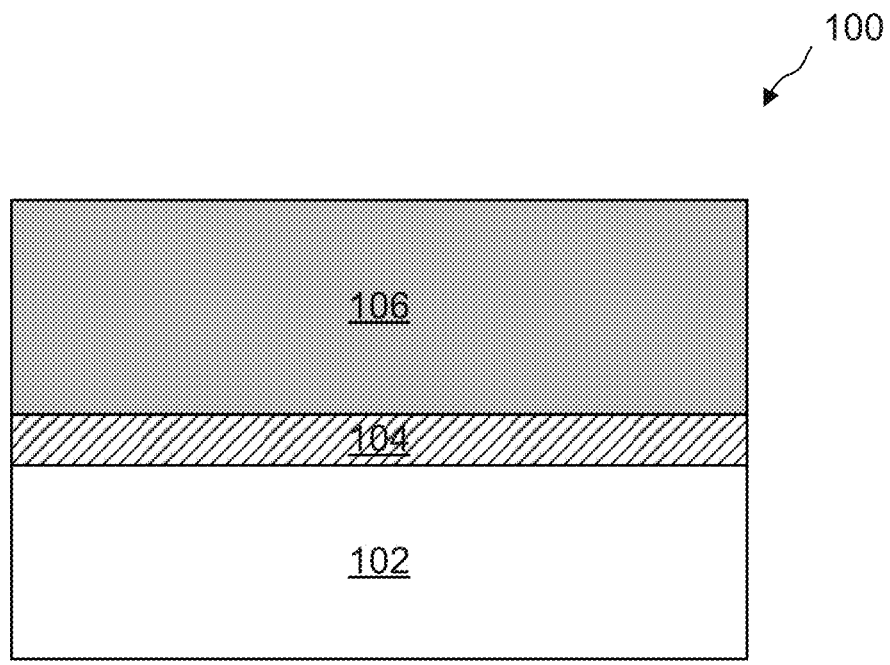
FIG. 1 is a cross-sectional view of a semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field effect transistor. An example of a FET is a metal oxide semiconductor field effect transistor (MOSFET). MOSFETs can be, for example, (i) planar structures built in and on the planar surface of a substrate such as a semiconductor wafer or (ii) built with vertical structures.

The term "FinFET" refers to a FET that is formed over a fin that is vertically oriented with respect to the planar surface of a wafer.

"S/D" refers to the source and/or drain junctions that form two terminals of a FET.

The term "vertical," as used herein, means nominally perpendicular to the surface of a substrate.

The expression "epitaxial layer" refers to a layer or structure of single crystal material. Likewise, the expression "epitaxially grown" refers to a layer or structure of single crystal material. Epitaxially-grown material may be doped or undoped.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

To avoid shorts in integrated circuits, semiconductor devices can be isolated from each other by isolation structures such as, for example, field oxides, shallow trench isolation (STI) regions, and/or dielectric-filled gap structures. As technologies progress, integrated circuits are characterized by decreasing dimension requirements over previous generation devices. However, there are challenges to implementing such features and processes. For example, decreased critical dimensions of the utilized photolithography process can lead to gap structures of higher aspect ratio (i.e., depth to width ratio of the gap structure). The high aspect ratio can cause pre-mature sealing of gap structures during the deposition of gap fill material and form defects such as voids and seams in the gap fill material. A weak seam or seam is a crack in the gap fill material that causes material discontinuation, which could lead to device performance degradation.

Various embodiments in accordance with this disclosure provide methods of forming a seamless and void-free silicon nitride ($SiN_x$, where x can be between a range of 0.5-1.5) gap fill layer. The $SiN_x$ gap fill layer can be formed using a multi-step deposition and in-situ treatment process. The formation process can include cycles of chemical vapor deposition (CVD) deposition processes and treatment processes using low Reactive Sticking Coefficient (RSC) molecules and one or more assist gases. Low RSC molecules can include Si—N—H molecules formed of, for example, perhydropolysilazane (PEPS) or trisilylamin (TSA). In some embodiments, molecules can include oligomers. Assist gas can be formed of, for example, ammonia ($NH_3$), helium (He), argon (Ar), or nitrogen ($N_2$). Nominal thickness and quality of the $SiN_x$ gap fill layer can be varied by at least the deposition condition, number of cycles, choices of molecules and assist gas.

In accordance with various embodiments of this disclosure, using the deposition and in-situ treatment process to form $SiN_x$ gap fill layers in semiconductor structures provides, among other things, benefits of (i) enhanced gap fill performance in high aspect ratio structures; (ii) void-free gap fill layer with no weak seams; (iii) optional planarization process due to the low RSC, nature of molecules; (iv) controllable thickness of $SiN_x$ gap fill layer by varying the condition and cycles of the formation process; and (v) improved device reliability due to enhanced quality of gap fill layers.

FIGS. 1-14 illustrate $SiN_x$ gap fill layer fabrication processes in various semiconductor devices using the multi-step deposition and treatment method. The fabrication process can produce enhanced $SiN_x$ gap fill layer and form void-free gap fill layers with no weak seams in various semiconductor devices such as, for example, planar device surfaces, trenches or gaps with low or high aspect ratios, and fin field-effect transistors (FinFETs) with multiple fins. The fabrication processes provided herein are exemplary, and alternative processes in accordance with this disclosure may be performed that are not shown in these figures.

FIG. 1 is a cross-sectional view of semiconductor structure 100, in accordance with some embodiments of the present disclosure. Semiconductor structure 100 includes a substrate 102, an etch stop layer 104, and a dielectric layer 106. Substrate 102 can be a silicon substrate, according to some embodiments. In some embodiments, substrate 102 can be (i) another semiconductor, such as germanium; (ii) a compound semiconductor including silicon carbide, gallium arsenide, gallium phosphide, indium phosphide, indium arsenide, gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), and/or indium antimonide; (iii) an alloy semiconductor including silicon germanium (SiGe); or (iv) combinations thereof. In some embodiments, substrate 102 can be a semiconductor on insulator (SOI). In some embodiments, substrate 102 can be an epitaxial material.

In some embodiments, etch stop layer 104 is formed on substrate 102 and can be used to prevent the etching of substrate 102. The composition of etch stop layer 104 can be $SiN_x$. Other exemplary compositions include silicon oxynitride, TiN, and/or other suitable materials. The deposition of etch stop layer 104 can be done by any suitable processes such as, for example, CVD, physical vapor deposition (PVD), atomic layer deposition (ALD), molecular beam epitaxy (MBE), high density plasma CVD (HDPCVD), metal organic (MOCVD), remote plasma CVD (RPCVD), plasma-enhanced CVD (PECVD), plating, other suitable methods, and/or combinations thereof.

Dielectric layer 106 is made of a dielectric material and can be formed of silicon oxide, spin-on-glass, silicon nitride, silicon oxynitride, fluorine-doped silicate glass (FSG), a low-k dielectric material, and/or other suitable insulating material. In some embodiments, the thickness of dielectric layer 106 can be in a range of about 50 nm to about 200 nm. In some embodiments, the thickness of dielectric layer 106 is greater than about 200 nm. The deposition of dielectric layer 106 can be done by any suitable processes such as, for example, CVD, PVD, ALD, MBE, HDPCVD, MOCVD, RPCVD, PECVD, other suitable methods, and/or combinations thereof. In some embodiments, semiconductor structure 100 can include capping layers, other etch stop layers, and/or other suitable materials. In some embodiments, semiconductor structure 100 can also include a processed integrated circuit wafer containing such as, for example, a plurality of transistors configured to be complementary metal-oxide-semiconductor (CMOS) circuits. These circuits can include logic, analog, RF (radio-frequency) parts made out of a variety of transistors, capacitors, resistors, and interconnections; these circuits are not shown in FIG. 1 for simplicity.

Figure 2:
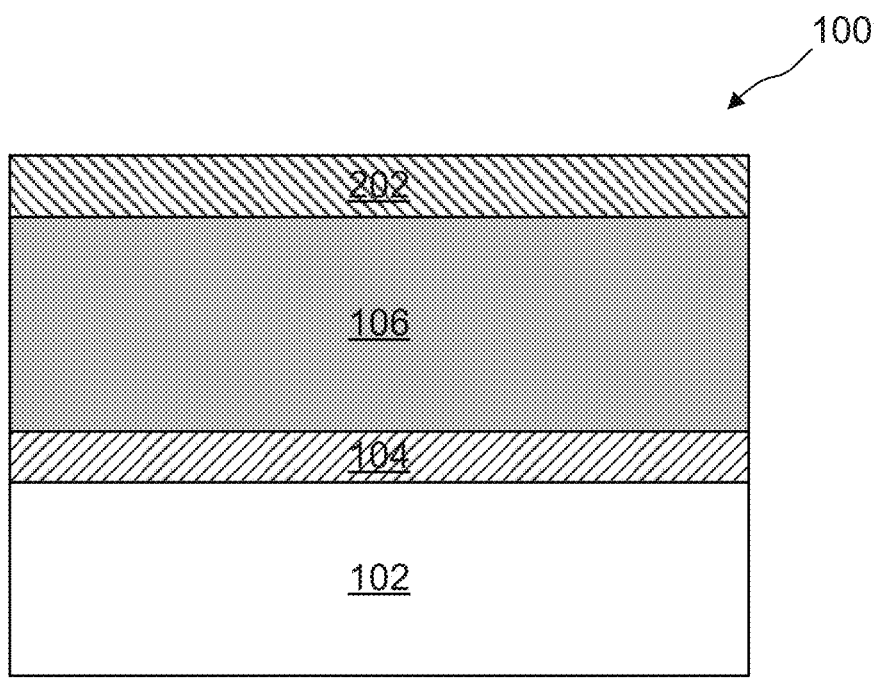
FIG. 2 is a cross-sectional view of a semiconductor structure after depositing a cap film, in accordance with some embodiments.

FIG. 2 is a cross-sectional view of semiconductor structure 100 after depositing a cap film, in accordance with some embodiments of the present disclosure. The cap film can include a metal hard mask layer 202. In some embodiments, the cap film can also include other layers which are not shown in FIG. 2 for simplicity. Exemplary composition of metal hard mask layer 202 can include TiN. Metal hard mask layer 202 can be formed using suitable deposition processes such as, for example, CVD, PVD, ALD, MBE, HDPCVD, MOCVD, RPCVD, PECVD, other suitable methods, and/or combinations thereof. In some embodiments, the thickness of metal hard mask layer 202 is in a range from about 250 angstroms to about 350 angstroms.

Figure 3:
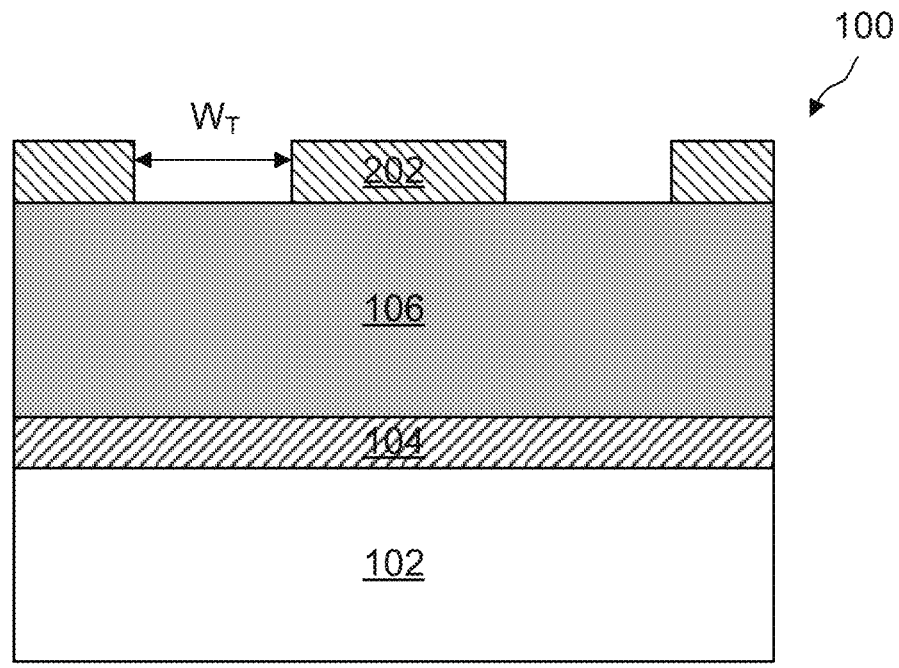
FIG. 3 is a cross-sectional view of a semiconductor structure after patterning a metal hard mask layer, in accordance with some embodiments.

FIG. 3 is a cross-sectional view of semiconductor structure 100 after patterning metal hard mask layer 202, in accordance with some embodiments of the present disclosure. The etching of metal hard mask layer 202 can include depositing a photoresist material on metal hard mask layer 202, exposing and patterning the photoresist to expose the portions of metal hard mask layer 202 to be etched, and etching the exposed portions of metal hard mask layer 202. As shown in FIG. 3, exposed portions of metal hard mask layer 202 not protected by the photoresist are etched away to expose the underlying dielectric layer 106, in accordance with some embodiments. The etching process of metal hard mask layer 202 can include any suitable etching technique such as, for example, dry etching, wet etching, reactive ion etching, and/or other etching methods. In some embodiments, the removed portions of metal hard mask layer 202 can have a width $W_T$ that is in a range of about 5 nm to about 20 nm; for example, the width $W_T$ can be 7 nm. In some embodiments, width $W_T$ can be less than 5 nm. It should be noted that the ranges of width $W_T$ described herein are merely provided as examples and can be selected based on product needs.

Figure 4:
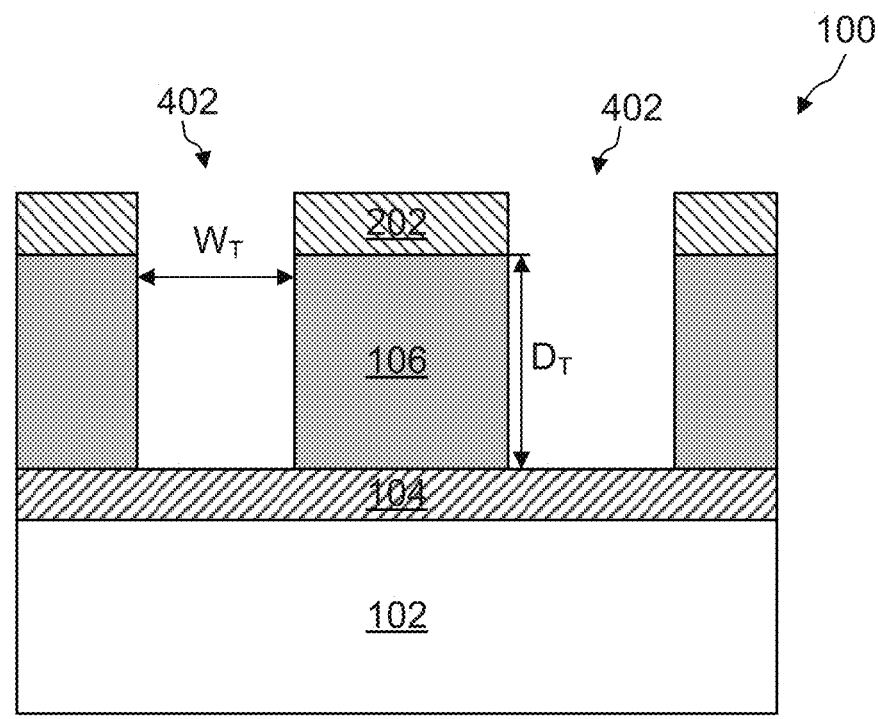
FIG. 4 is a cross-sectional view of a semiconductor structure after etching a dielectric layer using a metal hard mask as an etching mask, in accordance with some embodiments.

FIG. 4 is a cross-sectional view of semiconductor structure 100 after etching the dielectric layer using metal hard mask layer 202 as an etching mask, in accordance with some embodiments of the present disclosure. Patterns formed by the remaining metal hard mask layer 202 can be transferred to dielectric layer 106 by etching portions of dielectric layer 106 that are not protected by metal hard mask layer 202, therefore the formed trenches 402 can also have width $W_T$. The etch processes in dielectric layer 106 and can be plasma processes such as, for example, a reactive ion etching (RIE) process using oxygen-based plasma. In some embodiments, the RIE etching process may include other etchant gas such as, for example, nitrogen, carbon tetrafluoride ($CF_4$), and/or other suitable gases. Numerous other methods to form recesses such as trenches 402 in dielectric layer 106 can also be suitable. In some embodiments, the etching process can continue until the underlying etch stop layer 104 is exposed, in which etch stop layer 104 serves as an etch stop for the etch process. As a result, trenches 402 can have a depth $D_T$ equal to the depth of dielectric layer 106. In some embodiments, the depth $D_T$ of trench 402 can be controlled by the etching parameters and can be in a range of about 50 nm to about 150 nm. For example, depth $D_T$ can be about 140 nm, in accordance with some embodiments. It should be noted that the ranges of depth $D_T$ described herein are merely provided as examples and can be selected based on product needs. In some embodiments, trenches 402 can have a high aspect ratio (i.e., depth to width ratio of the trench) that is in a range of about 6-20. For example, trench 402 can have a width $W_T$ of 10 nm and a depth $D_T$ of 200 nm (which results in an aspect ratio of 20:1, in some embodiments.

Figure 5:
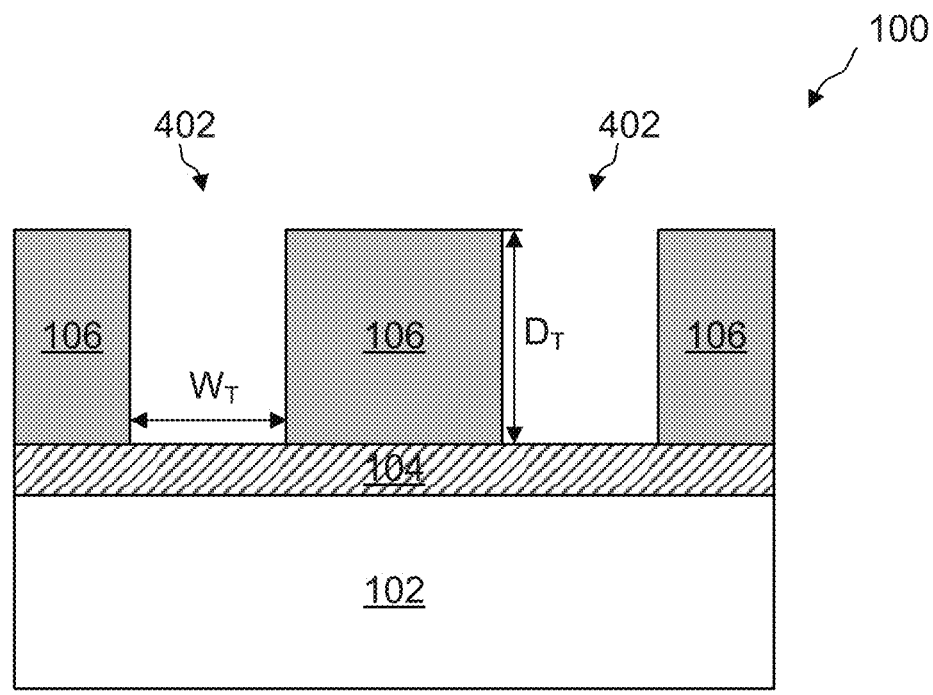
FIG. 5 is a cross-sectional view of a semiconductor structure after removing a metal hard mask layer, in accordance with some embodiments.

FIG. 5 is a cross-sectional view of semiconductor structure 100 after removing metal hard mask layer 202, in accordance with some embodiments of the present disclosure. Metal hard mask layer 202 can be removed using suitable processes such as, for example, dry etching, wet etching, reactive ion etching, and/or other etching methods. Any other suitable methods may alternatively be utilized such as, for example, a chemical mechanical polishing (CMP) process that can also planarize the remaining surfaces of dielectric layer 106.

Figure 6:
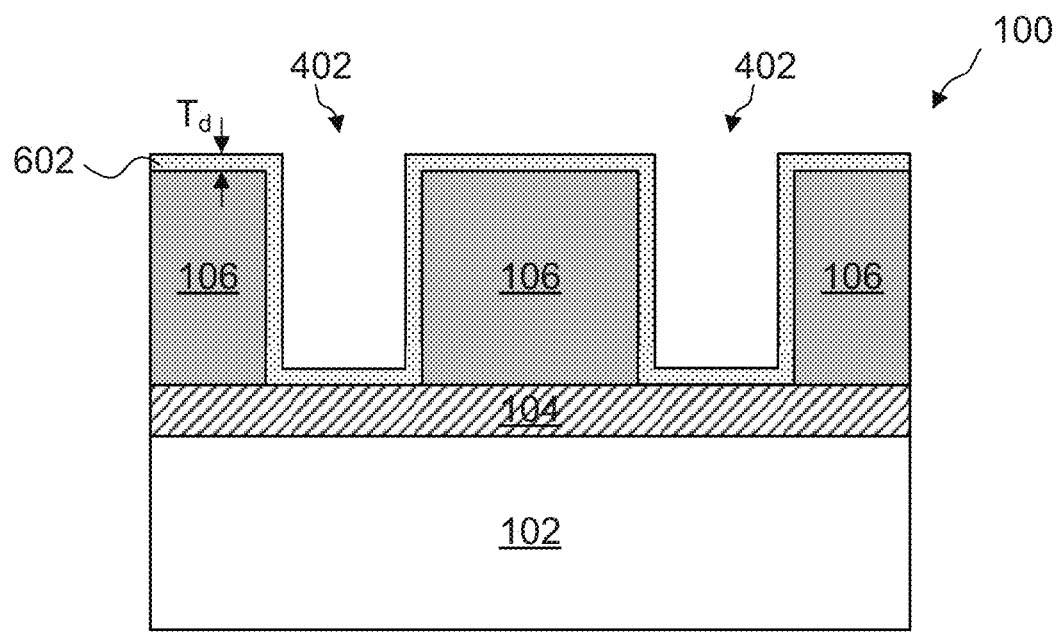
FIG. 6 is a cross-sectional view of a semiconductor structure after depositing a dielectric liner on exposed surfaces, in accordance with some embodiments.

FIG. 6 is a cross-sectional view of semiconductor structure 100 after depositing a dielectric liner on the exposed surfaces, in accordance with some embodiments of the present disclosure. As shown in FIG. 6, dielectric liner 602 can be deposited on the exposed sidewalls and top planar surfaces of dielectric layer 106 and exposed etch stop layer 104. Dielectric liner 602 can be made of a dielectric material such as, for example, silicon oxide, spin-on-glass, $SiN_x$, silicon oxynitride, FSG, a low-k dielectric material, and/or other suitable insulating material. In some embodiments, the thickness $T_d$ of dielectric liner 602 can be in a range of about 0 nm to about 20 nm. The deposition of dielectric liner 602 can be done by any suitable processes such as, for example, CVD, PVD, ALD, MBE, HDPCVD, MOCVD, RPCVD, PECVD, other suitable methods, and/or combinations thereof.

Figure 7:
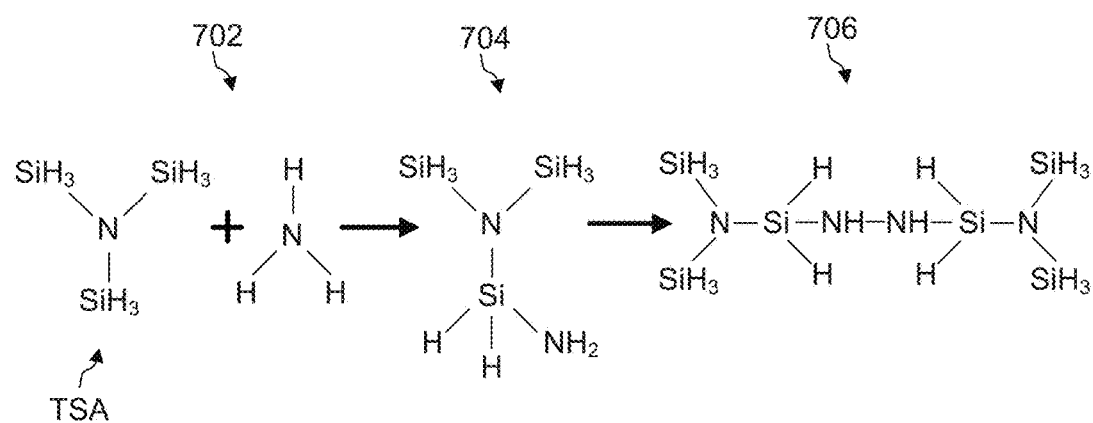
FIG. 7 is a schematic representation of exemplary chemical changes of molecular structures of a low RSC molecule and an assist gas during a deposition and in-situ treatment process, in accordance with some embodiments.
Figure 8:
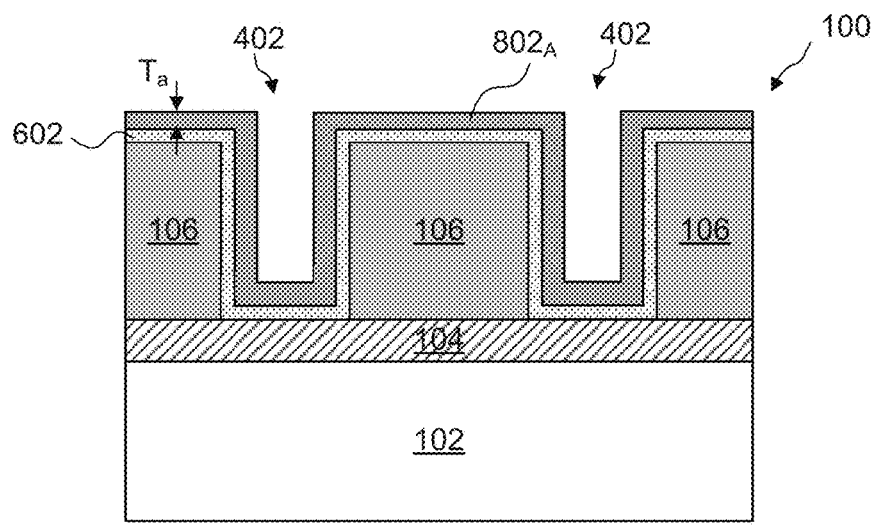
FIG. 8 is a cross-sectional view of a semiconductor structure after forming a first sub-layer of $SiN_x$ gap fill layer, in accordance with some embodiments.
Figure 9:
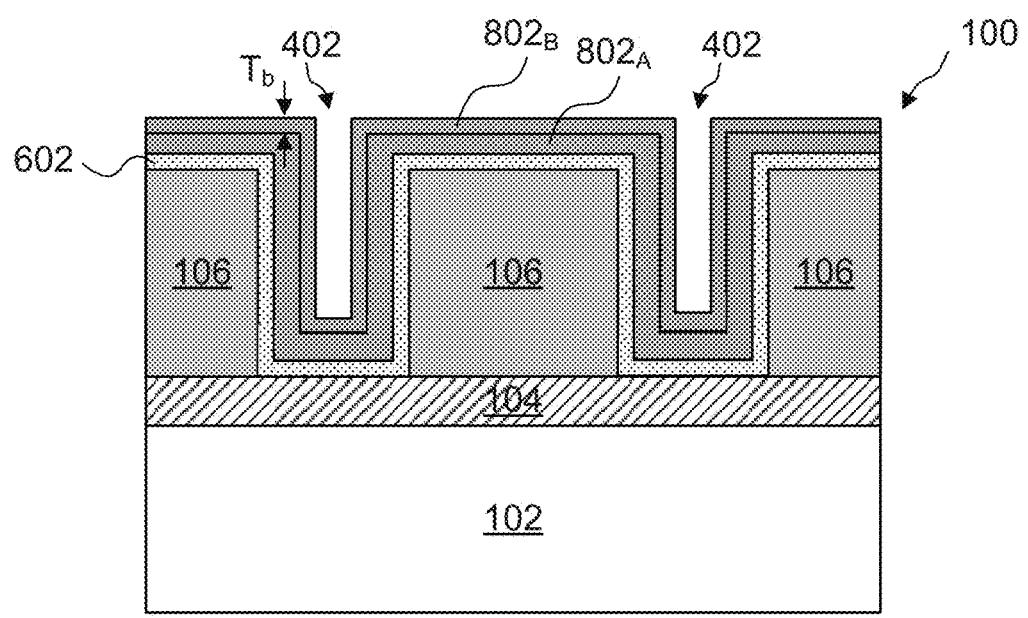
FIG. 9 is a cross-sectional view of a semiconductor structure after forming a second sub-layer of $SiN_x$ gap fill layer, in accordance with some embodiments.

FIGS. 7-9 provide exemplary molecular structures of precursor gases as well as various views of a semiconductor device fabrication process that illustrate fabrication processes of a gap fill layer using the multi-step deposition and treatment method, in accordance with some embodiments of the present disclosure. The formation of gap fill layer can include cycles of deposition and in-situ treatment processes. During the formation process, each cycle of the deposition and the in-situ treatment process can form a sub-layer of the gap fill layer, and the cycles can be repeated until a nominal thickness and quality of the gap fill layer can be achieved. In some embodiments, the deposition process can be a CVD process utilizing precursor gases such as, for example, low RSC molecules and one or more assist gases. In some embodiments, the gap fill layer can be a $SiN_x$ gap fill layer. In some embodiments, the deposition of $SiN_x$ gap fill layer can be accomplished by any suitable processes such as, for example, a flowable CVD (FCVD) process. Low RSC molecules can be vaporized in a plasma environment of the FCVD process and exhibit low chemical absorption characteristics toward semiconductor surfaces due to weak van der Waals force of the low RSC molecules. Therefore, low RSC molecules can enable a "bottom-up" formation of the $SiN_x$ gap fill layer in trenches or gaps of the semiconductor structures.

FIG. 7 illustrates exemplary chemical changes of the molecular structures of a low RSC molecule and an assist gas during deposition and in-situ treatment, in accordance with some embodiments of the present disclosure. In some embodiments, the deposition process can include a CVD process utilizing precursor gases such as, for example, low RSC molecules and one or more assist gases. In some embodiments, the low RSC molecule can include trisilylamin (TSA) or other molecules such as perhydropolysilazane (PHPS). In some embodiments, the assist gas can be formed of, for example, $NH_3$, $N_2$, He, Ar, other suitable gas, or any combinations thereof. Views 702 and 704 illustrate schematic drawings of the molecular structures of the precursors and assist gases used in the deposition process, according to some embodiments. Using an FCVD fabrication process that uses TSA and ammonia as an example, view 702 includes a schematic drawing of the molecular structure of TSA that contains three $SiH_3$ molecules bonded to a nitrogen atom. View 702 also includes a schematic drawing of a molecular structure of the assist gas such as $NH_3$ which contains three hydrogen atoms bonded to a nitrogen atom. The TSA molecules are operated upon by the ammonia gas in a plasma environment of the FCVD process which provides energy that breaks bonds in the $SiH_3$ molecules of the TSA to form Si—$NH_2$ bonds. The assist gas can provide as a nitrogen source for the deposition process. The TSA molecule forms the molecule shown in view 704 and deposits as $SiN_x$ film on the surfaces of the semiconductor structures. The deposition process can be performed at a temperature in a range of about 10° C. to about 200° C. View 706 shows the molecular structure of the deposited $SiN_x$ film after the treatment process. The treatment process can include an annealing process using groups of plasma activated assist gas such as, for example, $NH_3$, $N_2$, He, Ar, other suitable gas, or any combinations thereof. It should be noted that one or more assist gases can be used in the treatment process. The treatment process can be performed in-situ and at a temperature similar to the deposition process. During the treatment process, the plasma activated assist gas can provide energy for breaking the N—H bonds of the deposited molecule and form NH—NH bonds between adjacent molecules. This newly formed NH—NH bonds bring adjacent molecules into a more compact form (i.e., film densification) and therefore remove voids and seams in the deposited $SiN_x$ gap fill layer. During the treatment process, the assist gases can be used as nitrogen sources and also for plasma or radical formation and dilution purposes. For example, assist gases can be reactant gases such as, for example, ammonia, nitrogen, other suitable reactant gases, and/or combinations thereof. The reactant gases can be used as nitrogen sources to provide nitrogen atoms that are formed as a part of the molecular compositions of the SiNx gap fill layer. In some embodiments, assist gases can be inert gases such as, for example, He, Ar, other suitable inert gases, and/or combinations thereof. The inert gases can be used for radical formation and dilution purposes. The deposition and treatment process can be tuned and repeated such that a nominal thickness and quality of the final $SiN_x$ gap fill layer is achieved by depositing multiple sub-layers, which can be explained in further details below with respect to FIGS. 8-10.

FIG. 8 is a cross-sectional view of semiconductor structure 100 after a first sub-layer of $SiN_x$ gap fill layer is formed, in accordance with some embodiments of the present disclosure. Using the multi-step deposition and treatment method, a $SiN_x$ gap fill layer can contain multiple sub-layers formed by the fabrication process. As shown in FIG. 8, a first sub-layer $802_A$ of a $SiN_x$ gap fill layer is formed on the exposed surfaces of dielectric liner 602, including the top planar surfaces of semiconductor structure 100 and the bottom surface and sidewalls of trenches 402. The deposition process can include a CVD process using low RSC molecules and one or more assist gases. In some embodiments, the low RSC molecules can be a Si—N—H molecule such as, for example, TSA. In some embodiments, PHPS can be used. The deposition process is followed by a treatment process where one or more plasma-activated assist gas can form NH—NH bonds between adjacent molecules. The deposition and treatment process described herein can provide enhanced gap fill capability of the deposited $SiN_x$ gap fill layer and remove voids and seams in the deposited $SiN_x$ gap fill layer, especially at the corners of trench/gap structures as well as the location where deposited gap fill layers merge. The thickness $T_a$ of the first sub-layer $802_A$ can be in a range of about 1 to about 400 nm. An optional ultraviolet (UV) curing process can be used following the formation process to debond hydrogen bonds and remove hydrogen atoms from the deposited gap fill layers. The UV curing process provides, among other things, benefits of (i) further improve film quality; (ii) remove in-fin charges; and (iii) reduce wet etch rate of the deposited gap fill layer. If a UV curing process is utilized, the first sub-layer $802_A$ should have sufficient thickness to protect the underlying dielectric liner 602 from UV exposure. For example, the thickness $T_a$ of first sub-layer $802_A$ should be greater than the penetration depth of UV light in the gap fill layer.

FIG. 9 is a cross-sectional view of semiconductor structure 100 after a second sub-layer of $SiN_x$ gap fill layer is formed, in accordance with some embodiments of the present disclosure. Using the multi-step deposition and treatment method as described above with respect to FIGS. 7 and 8, a second sub-layer $802_B$ of the $SiN_x$ gap fill layer can be formed on the exposed surfaces of first sub-layer $802_A$. The exposed surfaces include the top planar surfaces of first sub-layer $802_A$ that are formed over dielectric layer 106, as well as the exposed surfaces in trenches 402. The thickness $T_b$ of second sub-layer $802_B$ can be similar or less than $T_a$ of first sub-layer $802_A$ and can be in a range of about 1 nm to about 400 nm.

Figure 10:
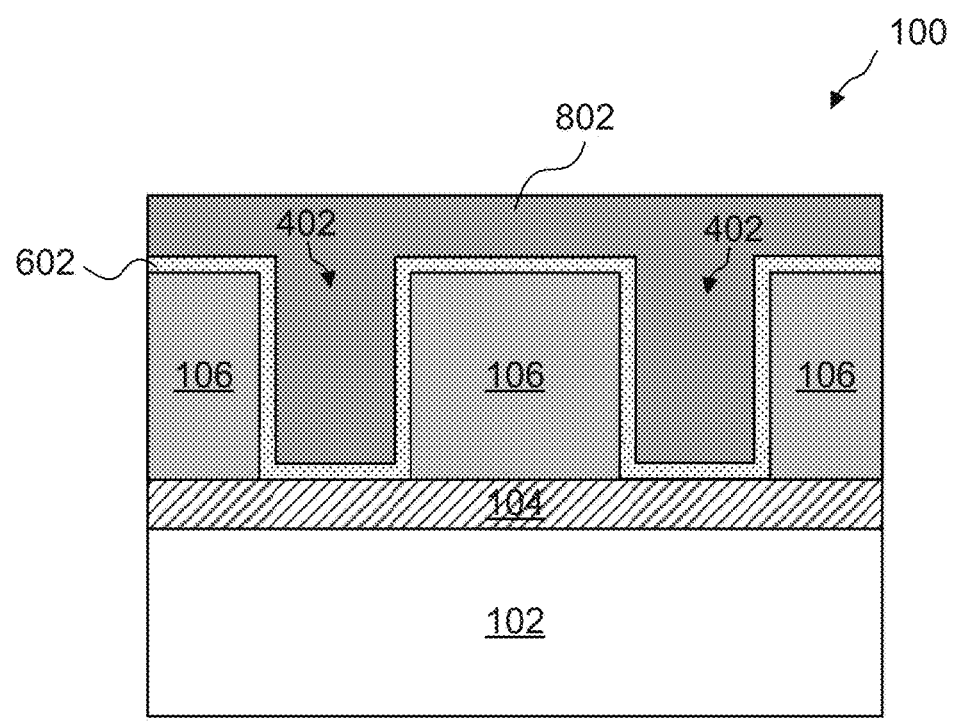
FIG. 10 is a cross-sectional view of a semiconductor structure after filling trenches with a $SiN_x$ gap fill layer, in accordance with some embodiments.

FIG. 10 is a cross-sectional view of semiconductor structure 100 after a $SiN_x$ gap fill layer fills the trenches, in accordance with some embodiments of the present disclosure. Using the multi-step deposition and treatment method as described above with respect to FIGS. 7-9, one or more sub-layers of the $SiN_x$ gap fill layer can be formed in trenches 402 and over second sub-layer $802_B$ by performing multiple deposition and treatment processes. The multiple sub-layers (e.g., at least first and second sub-layers $802_A$ and $802_B$) can form a $SiN_x$ gap fill layer 802 shown in FIG. 10. More sub-layers may be needed, while the number of cycles described herein is merely provided as an example, the number of the multi-step deposition/treatment cycles can depend on a number of factors, including, but not limited to, the nominal thickness and quality of the gap fill layer or the aspect ratio of the trench/gap structures. Additionally, due to the low RSC nature of the molecules, the top surface of formed gap fill layer 802 can be substantially planar and no further planarization process may be needed.

Figure 11:
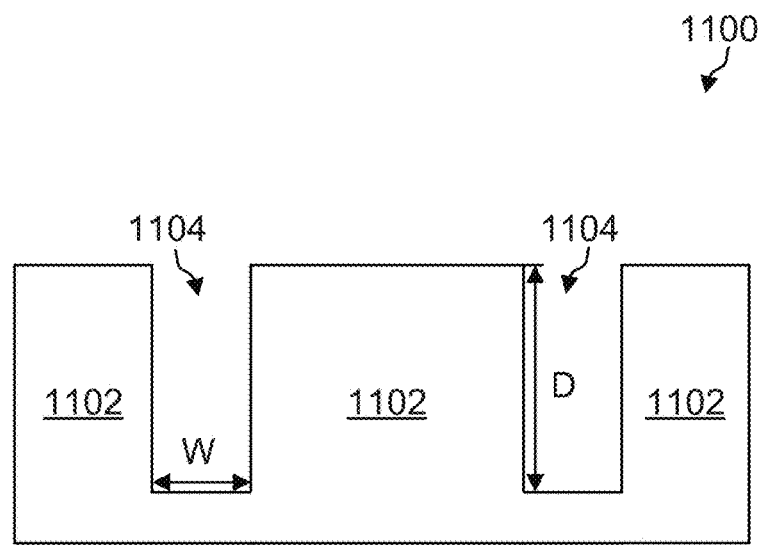
FIG. 11 is a cross-sectional view of a semiconductor substrate with trenches, in accordance with some embodiments.

FIG. 11 is a cross-sectional view of semiconductor substrate with trenches, in accordance with some embodiments of the present disclosure. In some embodiments, the gap fill layer can be formed directly in trenches or gaps of semiconductor structures without the underlying dielectric layers or etch stop layers. As shown in FIG. 11, semiconductor structure 1100 includes a substrate 1102 and trenches 1104. Substrate 1102 can be a silicon substrate, according to some embodiments. In some embodiments, substrate 1102 can have similar composition as substrate 102 described with respect to FIG. 1. For example, substrate 1102 can be (i) another semiconductor, such as germanium; (ii) a compound semiconductor including silicon carbide, gallium arsenide, gallium phosphide, indium phosphide, indium arsenide, GaAsP, AlInAs, AlGaAs, GaInAs, GaInP, GaInAsP, and/or indium antimonide; (iii) an alloy semiconductor including SiGe; or (iv) combinations thereof. In some embodiments, substrate 1102 can be an SOI material. In some embodiments, substrate 1102 can be an epitaxial material.

Trenches 1104 can be formed in substrate 1102 using a similar process as described with respect to FIGS. 1-4, such as patterning and etching the substrate 1102. In some embodiments, the patterning and etching of substrate 1102 can include depositing a photoresist material on substrate 1102, exposing and patterning the photoresist to expose the portions of substrate 1102 to be etched, and etching the exposed portions of substrate 1102. In some embodiments, the patterning and etching of substrate 1102 can include depositing and patterning a hard mask layer to protect portions of substrate 1102 from being etched while exposed portions of substrate 1102 can be removed. The etching process of substrate 1102 can include any suitable etching technique such as, for example, dry etching, wet etching, reactive ion etching, and/or other etching methods. The removal process can form trenches 1104 that have width W and depth as illustrated in FIG. 11. The depth D of trenches 1104 can be varied by adjusting the etching parameters such as, for example, etch time and/or etch conditions of the removal process, rather than relying on an optional etch stop layer to provide an etch stop for the removal process. In some embodiments, the depth D of trench 1104 can be in a range of about 50 nm to about 150 nm. For example, depth $D_T$ can be about 140 nm, in accordance with some embodiments. It should be noted that the ranges of depth D described herein are merely provided as examples and can be selected based on product needs. In some embodiments, trenches 1104 can have a high aspect ratio that is in a range of about 6-20. For example, trench 1104 can have a width W of 10 nm and a depth $D_T$ of 200 nm (which results in an aspect ratio of 20:1), in some embodiments. Trenches 1104 can also have a low aspect ratio that is below about 6, in some embodiments. Width W can be in a range of about 5 nm to about 20 nm. For example, the width W can be 7 nm. In some embodiments, width W can be less than 5 nm. It should be noted that the ranges of width W described herein are merely provided as examples and can be selected based on product needs.

Figure 12:
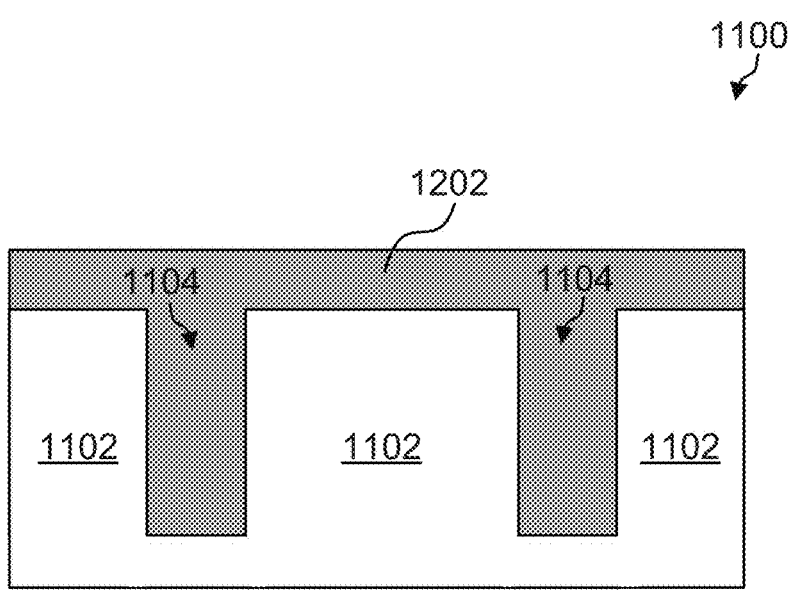
FIG. 12 is a cross-sectional view of a semiconductor structure after depositing a $SiN_x$ gap fill layer in the trenches, in accordance with some embodiments.

FIG. 12 is a cross-sectional view of semiconductor structure after depositing a $SiN_x$ gap fill layer in the trenches, in accordance with some embodiments of the present disclosure. A gap fill layer 1202 can be deposited in trenches 1104 and directly on substrate 1102. The gap fill layer 1202 can be formed using a multi-step process and contain one or more sub-layers, where each sub-layer can be formed using a deposition and treatment process to produce a void-free and seamless gap fill layer. In some embodiments, each sub-layer can be a $SiN_x$ layer. The deposition process can include forming a first sub-layer of the $SiN_x$ gap fill layer 1202 on the exposed surfaces of substrate 1102, such as the top planar surfaces of substrate 1102 and the bottom and sidewalls of trenches 1104. The formation process can be similar to the multi-step deposition and treatment process described with respect to FIGS. 7-10. For example, the deposition process can include a CVD process using low RSC molecules and one or more assist gases. In some embodiments, the low RSC molecules can be a Si—N—H molecule such as, for example, TSA. In some embodiments, MPS can be used. The deposition process is followed by a treatment process where one or more plasma-activated assist gas can form NH—NH bonds between adjacent molecules. The thickness of the first sub-layer can be in a range of about 1 nm to about 400 nm. An optional UV curing process can be used following the formation process to debond hydrogen bonds and remove hydrogen atoms from the deposited gap fill layers. If a UV curing process is utilized, the first sub-layer should have sufficient thickness to protect the underlying substrate 1102 from UV exposure. For example, the thickness of a first sub-layer should be greater than the penetration depth of UV light in the gap fill layer. The deposition and treatment process can be repeated to form more sub-layers until a $SiN_x$ gap fill layer 1202 having nominal thickness and quality has been formed at least in trenches 1104.

The enhanced gap fill layer formed using the multi-step deposition and treatment process can also be used to fill gaps or trenches in FinFETs structures. A FinFET utilizes a vertical device structure and can have advantages over other types of transistors (e.g., planar field-effect transistors) such as, for example, greater channel control, reduced short channel effect, higher packing density and lower subthreshold leakage currents. However, although FinFETs may exhibit improved performance, they are not immune to complications resulting from reduced device size. As the fin size and fin-fin separation are reduced, transistor performance can be adversely impacted in a number of ways. For example, reductions in body thickness (corresponding to a reduction in fin width) can decrease the mobility of carriers through the channel region. On the other hand, reduction in fin-fin separation can lead to high aspect ratio gaps between adjacent fins. The high aspect ratio can cause pre-mature sealing of gap structures during the dielectric material deposition that fills the gaps and form defects such as voids and seams in the dielectric gap fill layer. As a consequence, electrical shorts may occur in FinFETs, resulting in lower yield and reduced device performance. Enhanced gap fill layer such as $SiN_x$ gap fill layer formed using the multi-step deposition and treatment processes can be used to fill the gaps between multiple fins of the FinFET structures and eliminate voids and seams in the gap fill material.

Figure 13:
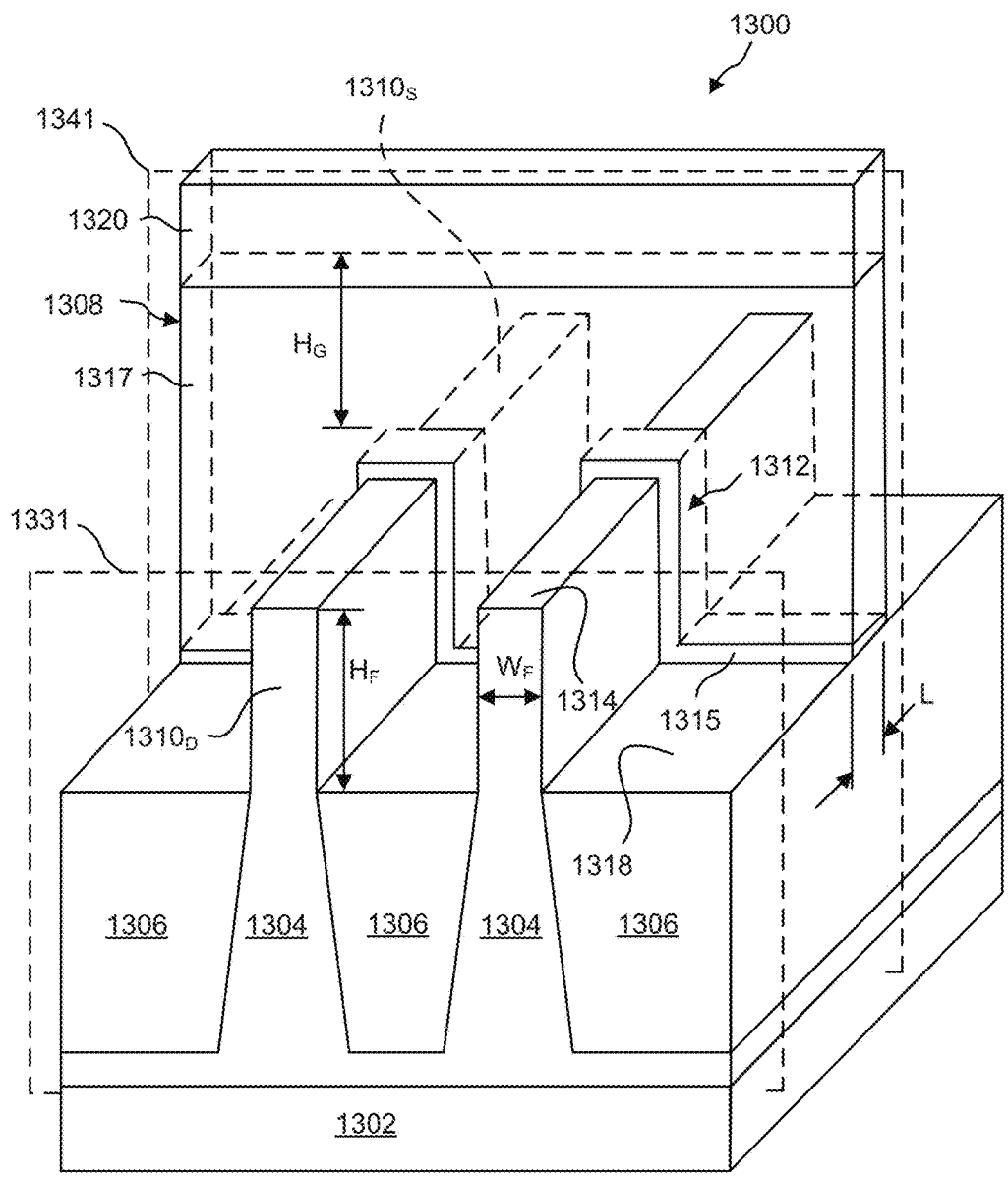
FIG. 13 is an isometric view of a FinFET structure, in accordance with some embodiments.

Before describing the embodiments related to the formation process of enhanced gap fill layer in FinFETs structures, an example fabrication process for a FinFET is presented. FIG. 13 provides an isometric view of a semiconductor device that includes partially fabricated FinFETs, in accordance with some embodiments.

FIG. 13 is an isometric view of a semiconductor structure 1300, in accordance with some embodiment of the present disclosure. Semiconductor structure 1300 includes FinFETs. Semiconductor structure 1300 includes a substrate 1302, a plurality of fins 1304, a plurality of isolation structures 1306, and a gate structure 1308. Gate structure 1308 is disposed over sidewalls and a top surface of each of fins 1304. Fins 1304 and isolation structures 1306 have top surfaces 1314 and 1318, respectively. Gate structure 1308 includes a gate dielectric structure 1315 and a gate electrode 1317. In some embodiments, one or more additional layers or structures can be included in gate structure 1308.

FIG. 13 shows a hard mask 1320 disposed on a top surface of gate electrode 1317. Hard mask 1320 is used to pattern, such as by etching, gate structure 1308. In some embodiments, hard mask 1320 is made of a dielectric material such as, for example, silicon nitride. The isometric view of FIG. 13 is taken after the patterning process (e.g., etching) of a gate dielectric layer and a gate electrode layer to form gate structure 1308. FIG. 13 shows a gate structure 1308. Integrated circuits can include a plurality of such, and similar, gate structures.

Each of the plurality of fins 1304 shown in FIG. 13 includes a pair of source/drain (S/D) terminals, where a source terminal is referred to as source region 1310$_S$ and a drain terminal is referred to as drain region 1310$_D$. The source and drain regions 1310$_S$ and 1310$_D$ are interchangeable and are formed in, on, and/or surrounding fins 1304. A channel region 1312 of fins 1304 underlies gate structure 1308. Gate structure 1308 has a gate length L and a gate width ($2 \times H_F + W_F$), as shown in FIG. 1. In some embodiments, the gate length L is in a range from about 10 nm to about 30 nm. In some embodiments, the gate length L is in a range from about 3 nm to about 10 nm. In some embodiments, the fin width $W_F$ is in a range from about 6 nm to about 12 nm. In some embodiments, the fin width W is in a range from about 4 nm to about 6 nm. Gate height $H_G$ of gate structure 1308, measured from a fin top surface 1314 to the top of gate structure 1308, is in a range from about 50 nm to about 80 nm, in some embodiments. Fin height $H_F$ of fin 1304, measured from the isolation structure top surface 1318 to fin top surface 1314, is in a range from about 5 nm to about 100 nm, in some embodiments.

Substrate 1302 can be a silicon substrate, according to some embodiments. In some embodiments, substrate 1302 can be (i) another semiconductor, such as germanium (Ge); (ii) a compound semiconductor including silicon carbide, gallium arsenide, gallium phosphide, indium phosphide, indium arsenide, GaAsP, AlInAs, AlGaAs, GaInAs, GaInP, GaInAsP, and/or indium antimonide; (iii) an alloy semiconductor including SiGe; or (iv) combinations thereof. In some embodiments, substrate 1302 can be an SOI material. In some embodiments, substrate 1302 can be an epitaxial material.

Fins 1304 are active regions where one or more transistors are formed. Fins 1304 can include: (i) silicon (Si) or another elementary semiconductor, such as germanium; (ii) a compound semiconductor including silicon carbide, gallium arsenide, gallium phosphide, indium phosphide, indium arsenide, GaAsP, AlInAs, AlGaAs, GaInAs, GaInP, GaInAsP and/or indium antimonide; (iii) an alloy semiconductor including SiGe; or (iv) combinations thereof. Fins 1304 can be fabricated using suitable processes including photolithography and etch processes. The photolithography process can include forming a photoresist layer overlying the substrate (e.g., on a silicon layer), exposing the resist to a pattern, performing post-exposure bake processes, and developing the resist to form a masking element including the resist. The masking element can then be used to protect regions of the substrate while an etch process forms recesses into substrate 1302, leaving protruding fins. The recesses can be etched using a reactive ion etch (RIE) and/or other suitable processes. Numerous other methods to form fins 1304 on substrate 1302 may be suitable. For example, fins 1304 can include epitaxial material, in accordance with some embodiments.

Isolation structures 1306 can partially fill the recesses and can be made of a dielectric material such as, for example, silicon oxide, spin-on-glass, $SiN_x$, silicon oxynitride, FSG, a low-k dielectric material, other suitable insulating material, and/or combinations thereof. In some embodiments, isolation structures 1306 can be shallow trench isolation (STI) structures and are formed by etching trenches in substrate 1302. The trenches can be filled with insulating material, followed by a CMP and etch-back process. Other fabrication techniques for isolation structures 1306 and/or fins 1304 are possible. Isolation structures 1306 can include a multi-layer structure such as, for example, a structure with one or more liner layers. Isolation structures 1306 can also be formed by depositing an enhanced gap fill layer using the multi-step deposition and treatment process to eliminate voids and seams in the gap fill material.

Gate structure 1308 can include a gate dielectric layer 1315, a gate electrode 1317, a spacer layer 1311, and/or one or more additional layers, according to some embodiments. For ease of description, spacer layer 1311 is not shown in FIG. 1. In some embodiments, gate structure 1308 uses polysilicon as gate electrode 1317. Also shown in FIG. 13 is a hard mask 1320 disposed on a top surface of gate electrode structure 1317. Hard mask 1320 is used to pattern, such as by etching, gate structure 1308. In some embodiments, hard mask 1320 is made of a dielectric material, such as silicon nitride.

Although gate structure 1308 is described as using polysilicon or amorphous silicon for gate electrode 1317, gate structure 1308 can be a sacrificial gate structure such as formed in a replacement gate process used to form a metal gate structure. The metal gate structure and the deposited enhanced $SiN_x$ is further described with reference to FIG. 15.

Exemplary p-type work function metals that can be included in the metal gate structure are TiN, tantalum nitride (TaN), ruthenium (Ru), molybdenum (Mo), aluminum (Al), tungsten nitride (WN), zirconium disilicide ($ZrSi_2$), molybdenum disilicide ($MoSi_2$), tantalum disilicide ($TaSi_2$), nickel disilicide ($NiSi_2$), platinum (Pt), other suitable p-type work function materials, or combinations thereof. Exemplary n-type work function metals that can be included in the metal gate structure are Al, titanium (Ti), silver (Ag), tantalum aluminum (TaAl), tantalum aluminum carbon (TaAlC), tantalum aluminum nitride (TiAlN), tantalum carbide (TaC), tantalum carbide nitride (TaCN), tantalum silicide nitride (TaSiN), manganese (Mn), zirconium (Zr), other suitable n-type work function materials, or combinations thereof. A work function is associated with the material composition of the work function layer. Thus, the material of a work function layer is chosen to tune its work function so that a desired threshold voltage $V_{th}$ can be achieved by a device formed in the respective region. The work function layer(s) may be deposited by CVD, PECVD, ALD, other suitable processes, and/or combinations thereof.

A fill metal layer can be deposited over the work function metal layer(s). The fill metal layer fills in remaining portions of trenches or openings formed by removal of the sacrificial gate structure The fill metal layer can include Al, W, copper (Cu), and/or other suitable materials. The fill metal can be formed by ALD, CVD, PVD, plating, other suitable processes, and/or combinations thereof.

Semiconductor device structure 1300 described above includes fins 1304 and gate structure 1308. The semiconductor device structure 1300 may require additional processing to form various features such as, for example, lightly-doped-drain (LDD) regions and doped S/D structures. The term "LDD region" is used to describe lightly-doped regions disposed between a channel region of a transistor and at least one of the transistor's S/D regions. LDD regions can be formed in fins 1304 by doping. Ion implantation can be used, for example, for the doping process. Further, other processes can be used for doping the LDD regions.

Figure 14:
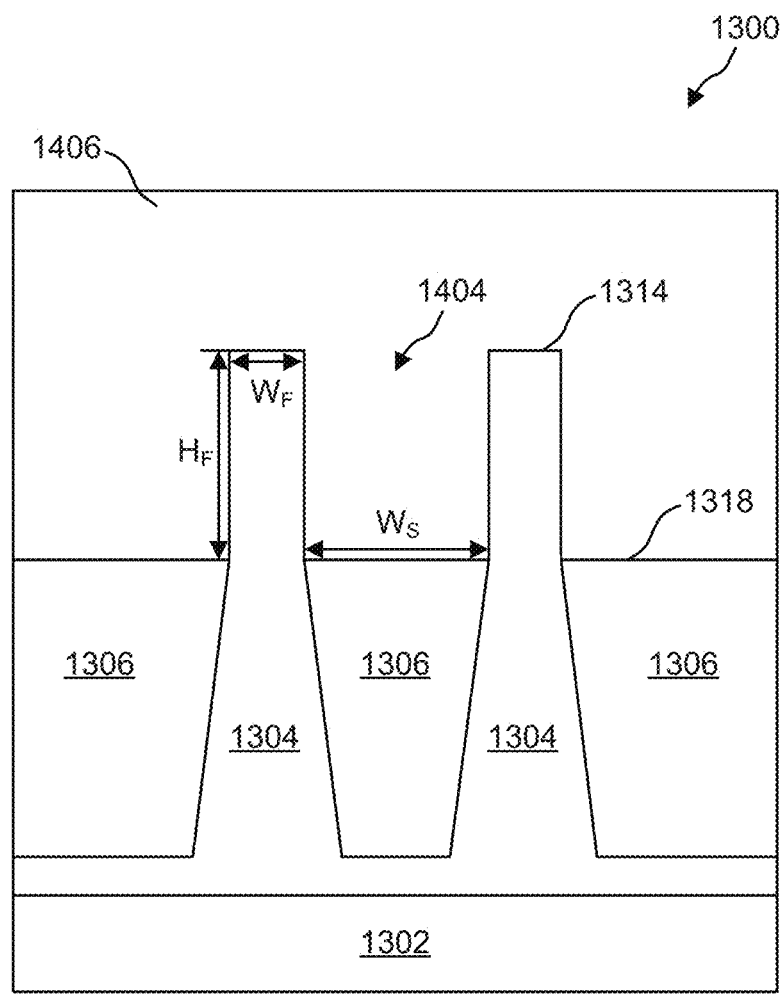
FIG. 14 is a cross-sectional view of a FinFET structure after depositing an enhanced gap fill layer, in accordance with some embodiments.

FIG. 14 is a cross-sectional view of semiconductor structure 1300 after an enhanced gap fill layer is deposited, in accordance with some embodiments of the present disclosure. The cross-sectional view of FIG. 14 is taken along the cut 1331 shown in FIG. 13. Fin height H of fin 1304, measured from the isolation structure top surface 1318 to fin top surface 1314, is in a range from about 5 nm to about 100 nm, in some embodiments. The fin height $H_F$ can be controlled by varying the depth of the recesses while forming fins 1304 and/or varying the depth of isolation structure 1306. For example, fin height $H_F$ can be about 140 nm, in accordance with some embodiments. It should be noted that the ranges of fin height $H_F$ described herein are merely provided as examples and can be selected based on product needs. As shown in FIG. 14, adjacent fins 1304 can be separated by a fin separation $W_S$ which is the horizontal distance measured between opposing fin sidewalls. In some embodiments, $W_S$ can be in a range of about 5 nm to about 20 nm. For example, $W_S$ can be about 7 nm, in some embodiments. The opposing sidewalls of the adjacent fins 1304 and the top surface of isolation structure 1306 located in between can form trenches 1404. Trenches 1404 can have a high aspect ratio (fin height $H_F$ divided by fin separation $W_S$) that is in a range of about 6-20. For example, trench 1404 can have a width $W_S$ of about 10 nm and fin height $H_F$ of about 200 nm (which results in an aspect ratio of 20:1), in some embodiments.

A $SiN_x$ gap fill layer 1406 can be deposited over exposed surfaces of semiconductor structure 1300 including, for example, in trenches 1404, over fin top surface 1304, and top surface of isolation structure 1318. The $SiN_x$ gap fill layer 1406 can be formed using a multi-step process and contain one or more sub-layers, where each sub-layer can be formed using a deposition and treatment process to produce a void-free and seamless gap fill layer. In some embodiments, each sub-layer can be a $SiN_x$ layer. Using the formation process of SiNx gap fill layer 1406 in trenches 1404 as an example, the deposition process can include forming a first sub-layer of the SiN$_x$ gap fill layer 1406 on the exposed surfaces of trench 1404 such as, for example, the top planar surfaces of isolation structure 1306 and the sidewalls of fins 1304. The formation process can be similar to the multi-step deposition and treatment process described with respect to FIGS. 7-10. For example, the deposition process can include a CVD process using low RSC molecules and one or more assist gases. In some embodiments, the low RSC molecules can be a Si—N—H molecule such as, for example, TSA. In some embodiments, PHI'S can be used. The deposition process is followed by a treatment process where one or more plasma-activated assist gas can form NH—NH bonds between adjacent molecules. An optional UV curing process can be used following the formation process to debond hydrogen bonds and remove hydrogen atoms from the deposited gap fill layers. If a UV curing process is utilized, the first sub-layer should have sufficient thickness to protect the underlying fins 1304 from UV exposure. For example, the thickness of a first sub-layer should be greater than the penetration depth of UV light in the gap fill layer. In some embodiments, the second or more sub-layers can have a thickness similar or less than the thickness of the first sub-layer. In some embodiments, the deposition and treatment process can be repeated to form more sub-layers until a SiN$_x$ gap fill layer 1406 having nominal thickness and quality has been formed at least in trenches 1404. It should be noted that a dielectric liner can be deposited between the SiN$_x$ gap fill layer and fins 1304. In some embodiments, SiNx gap fill layer 1406 can also be formed in place of isolation structure 1306.

Figure 15:
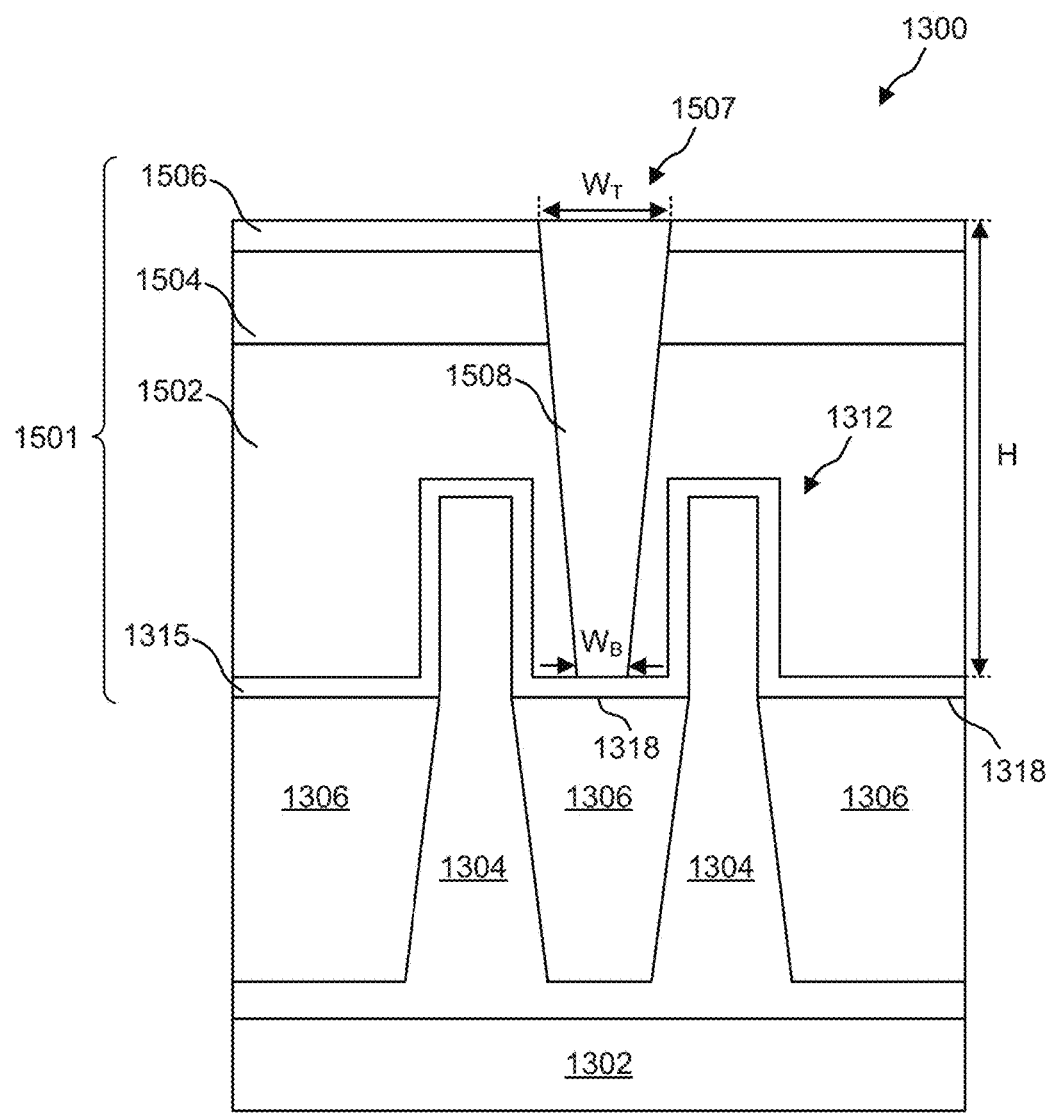
FIG. 15 is a cross-sectional view of a FinFET structure after a metal gate replacement process and depositing an enhanced gap fill layer, in accordance with some embodiments.

FIG. 15 is a cross-sectional view of semiconductor structure 1300 after a metal gate replacement process and an enhanced gap fill layer has been deposited, in accordance with some embodiments of the present disclosure. The cross-sectional view of FIG. 15 is taken along the cut 1341 shown in FIG. 13 after the metal gate replacement process.

Gate structure 1308 shown in FIG. 13 can be replaced by metal gate structure 1501 as shown in FIG. 15. Metal gate structure 1501 can include a metal gate electrode 1502, a protective layer 1504, a capping layer 1506, and an enhanced SiN$_x$ gap fill layer 1508. Metal gate structure 1501 can include barrier layer(s), gate dielectric layer(s), work function layer(s), fill metal layer(s) and/or other suitable materials for a metal gate structure. In some embodiments, the metal gate structure can include capping layers, etch stop layers, and/or other suitable materials.

Metal gate electrode 1502 is a conductive structure that formed on the substrate can include conducting materials such as tungsten, titanium, tantalum, copper, titanium nitride, tantalum nitride, molybdenum, other suitable metal or metal alloys, and/or combinations thereof. In some embodiments, metal gate electrode 1502 can also include a diffusion barrier layer such as, for example, titanium nitride (TiN) and titanium silicon nitride (TiSiN). In some embodiments, metal gate electrode 1502 can further include a work-function layer such as, for example, TiN and titanium aluminum (TiAl) for n-type FinFET devices and tantalum nitride (TaN) and TiAl for p-type FinFET devices. In some embodiments, forming metal gate electrode 1502 can be performed using an ALD process, a CVD process, other suitable deposition processes, and/or combinations thereof.

In some embodiments, after forming metal gate electrode 1502, a protective layer 1504 can be formed on the top surface of metal gate electrode 1502. Protective layer 1504 can protect metal gate electrode 1502 during subsequent processing. In some embodiments, protective layer 1504 can accommodate contact plugs for electrically connecting to S/D regions by preventing electrical shorts between the contact plugs and metal gate electrode 1502. In some embodiments, protective layer 1504 can be a self-aligned contact (SAC). Protective layer 1504 can be formed using a deposition process such as, for example, PVD, CVD, other suitable processes, and/or combinations thereof. Protective layer 1504 can be made of an insulating material, such as silicon oxide, silicon nitride, silicon oxynitride, silicon carbon nitride, any other suitable dielectric material, and/or combinations thereof. In some embodiments, a cap film such as capping layer 1506 can be formed over protective layer 1504. Capping layer 1506 can be formed using a semiconductor material such as silicon and deposited by PVD, CVD, other suitable processes, and/or combinations thereof.

Stack height H of gate structure 1501, measured from the top surface of capping layer 1506 to the top surface of gate dielectric structure 1315 is in a range from about 20 nm to about 200 nm, according to some embodiments. The stack height H can be controlled by varying the thickness of the deposited layers in gate structure 1501. For example, stack height H can be about 140 nm, in accordance with some embodiments. It should be noted that the ranges of stack height H described herein are merely provided as examples and can be selected based on product needs. A trench 1507 having sidewall and bottom surfaces is formed in gate structure 1501 and between opposing sidewalls of the adjacent fins 1304 and the top surface of isolation structure 1306. Trench 1507 is formed by patterning and etching capping layer 1506, and subsequently etching protective layer 1504 and metal gate electrode 1502. Trench 1507 can have a high aspect ratio (stack height H divided by trench width) that is in a range of about 6-20. In some embodiments, stack height H can be about 200 nm and the trench width can be about 10 nm (which results in an aspect ratio of 20:1). In some embodiments, the etching processes used to form trench 1507 can cause different trench widths measured at the top and bottom of the trench. For example, trench 1507 can have a top width W$_T$ of about 10 nm and a bottom width W$_B$ of about 5 nm. In some embodiments, respective top and bottom widths W$_T$ and W$_B$ can be in a range of about 5 nm to about 20 nm. For example, W$_T$ or W$_B$ can be about 7 nm. In some embodiments, the bottom of trench 1507 exposes a portion of the surface of gate dielectric structure 1315. In some embodiments, the etching process that forms trench 1507 also etches through gate dielectric structure 1315 and stops at the top surface of underlying isolation structure 1306. Stack height H would then be measured from the top surface of capping layer 1506 to isolation structure top surface 1318.

A SiN$_x$ gap fill layer 1508 can be deposited over exposed surfaces of semiconductor structure 1300 including trench 1507. Trench 1507 separates metal gate electrode 1502 into portions formed on respective adjacent fins 1304. SiN$_x$ gap fill layer 1508 is a void-free gap fill layer with no weak seams that is deposited into trench 1507 to provide reliable electrical isolation between the adjacent portions of metal gate electrode 1502. Similar to the deposition processes described above with reference to FIGS. 7-10 and 14, SiN$_x$ gap fill layer 1508 can be deposited using a multi-step process and contain one or more sub-layers, where each sub-layer can be formed using a deposition and treatment process to produce a void-free and seamless gap fill layer. In some embodiments, the deposition and treatment process can be repeated to form additional sub-layers until SiN$_x$ gap fill layer 1508 fills (e.g., completely fills) trench 1507. A dielectric liner can be deposited in trench 1507 before the SiN$_x$ gap fill layer deposition. A planarization process (e.g., chemical mechanical polishing process) can be performed after the SiN$_x$ gap fill layer deposition to remove excessive gap fill material deposited over capping layer 1506 such that the top surfaces of capping layer 1506 and SiN$_x$ gap fill layer 1508 are substantially coplanar. Voids in gap fill layers can cause device structure collapse during planarization processes and result in electrical connection breaks and degradation in device performance. SiN$_x$ gap fill layer 1508 provides improved device reliability and yield after the planarization process because no voids are formed in the gap fill layers.

Figure 16:
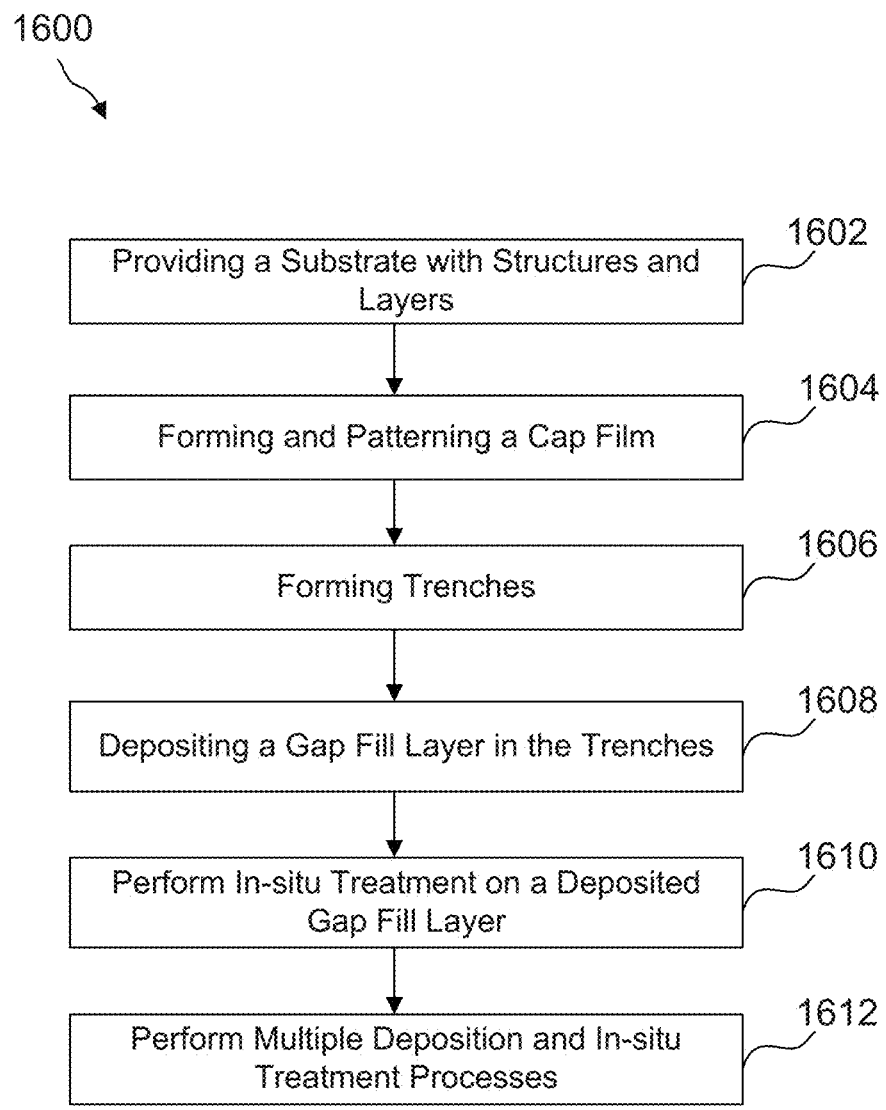
FIG. 16 is a flow diagram of an exemplary method of forming enhanced gap fill layer using multi-step deposition and in-situ treatment processes, in accordance with some embodiments.

FIG. 16 is a flow diagram of an example method 1600 of forming void-free and seamless gap fill layer in semiconductor structures, in accordance with some embodiments of the present disclosure. Based on the disclosure herein. Operations in method 1600 can be performed. Further, a person of ordinary skill in the art will recognize that the operations of method 1600 can be performed in a different order and/or vary.

At operation 1602, structures and layers are formed on and/or within a semiconductor structure, in accordance with some embodiments. The semiconductor structure can include a substrate, one or more etch stop layers, and one or more dielectric layers. The semiconductor structure can also include other layers as needed. The substrate can be a silicon substrate, according to some embodiments. An example of the substrate can be substrate 102 as described with respect to FIG. 1. In some embodiments, the substrate can be (i) another semiconductor, such as germanium; (ii) a compound semiconductor including silicon carbide, gallium arsenide, gallium phosphide, indium phosphide, indium arsenide, GaAsP, AlInAs, AlGaAs, GaInAs, GaInP, GaInAsP, and/or indium antimonide; (iii) an alloy semiconductor including SiGe; or (iv) combinations thereof. In some embodiments, the substrate can be an SOI. In some embodiments, the substrate can be an epitaxial material. In some embodiments, the etch stop layer is formed on the substrate and can be used to prevent the etching of the substrate. The composition of the etch stop layer can be silicon nitride. Other exemplary compositions include silicon oxynitride, TiN, and/or other suitable materials. The deposition of the etch stop layer can be done by any suitable processes. The dielectric layer is made of a dielectric material and can be formed of silicon oxide, spin-on-glass, SiN, silicon oxynitride, FSG, a low-k dielectric material, and/or other suitable insulating material. Dielectric layer deposition can be done by any suitable processes. In some embodiments, the semiconductor structure can include capping layers, other etch stop layers, and/or other suitable materials. In some embodiments, the semiconductor structure can also include a processed integrated circuit wafer containing such as, for example, a plurality of transistors configured to be CMOS circuits. In some embodiments, active and passive devices such as, for example, transistors, diodes, capacitors, resistors, inductors, and the like can be formed on and/or within the semiconductor substrate. In some embodiments, the semiconductor structure includes raised features such as, for example, fins. Fins can be fabricated using suitable processes including photolithography and etch processes.

At operation 1604, a cap film is deposited and patterned over the semiconductor structure, in accordance with some embodiments. The film can include a metal hard mask layer. In some embodiments, the cap film can also include other layers. An exemplary composition of the metal hard mask layer can include, for example, TiN. An example of the metal hard mask layer can be metal hard mask layer 202 as described with respect to FIG. 2. The metal hard mask layer can be formed using suitable deposition processes such as, for example, a CVD deposition process. In some embodiments, the thickness of the metal hard mask layer is in a range from about 250 angstroms to about 350 angstroms. The patterning process can be an etching process that includes depositing a photoresist material on the metal hard mask layer, exposing and patterning the photoresist to expose the portions of the metal hard mask layer to be etched, and etching the exposed portions of the metal hard mask layer. The etching process can include any suitable etching technique such as, for example, dry etching, wet etching, reactive ion etching, and/or other etching methods. The removed portions of the cap film can have widths that are in a range of about 5 nm to about 20 nm, in some embodiments.

At operation 1606, trenches are formed in device structures such as, for example, a substrate, a dielectric layer, or a metal gate electrode, in accordance with some embodiments. Portions of the device structure that are not protected are etched to form trenches, in accordance with some embodiments. The formed trenches can have substantially the same width measured at the top and bottom of the trenches, or the widths can be different along the trench depth. The etching processes can be plasma etching processes such as, for example, a RIE process using oxygen based plasma. In some embodiments, the RIE etching process may include other etchant gas such as, for example, nitrogen, $CF_4$, and/or other suitable gases. Numerous other methods to form recesses in the dielectric layer can also be suitable. Examples of formed trenches can be trenches 402, trenches 1104, trenches 1404, trench 1507, as respectively described in FIGS. 4, 11, 14, and 15. In some embodiments, the depth of the formed recess can be determined by the depth of a dielectric layer or by varying the etching process such that a nominal depth is achieved. In some embodiments, the depth of the formed recesses can also be determined by the fin height of FinFET structures. For example, the depth of the recess can be in a range of about 50 nm to about 150 nm, in accordance with some embodiments. The depth of the recess can also be greater than about 150 nm, and it should be noted that the ranges of depths described herein are merely provided as examples and can be selected based on product needs. In some embodiments, trenches can have a high aspect ratio that is in a range of about 6-20. For example, trench can have a width of about 10 nm and a depth of about 200 nm (which results in an aspect ratio of 20:1), in some embodiments. In some embodiments, the aspect ratio can be less than 6.

At operation 1608, a gap fill layer is deposited in the trenches, in accordance with some embodiments. A gap fill layer can be deposited in trenches and formed using a multi-step process and contain one or more sub-layers, where each sub-layer can be formed using a deposition and treatment process to produce a void-free and seamless gap fill layer. In some embodiments, the enhanced gap fill layer can be formed on a planar surface. In some embodiments, each sub-layer can be a SiN$_x$ layer. The deposition process can include forming a first sub-layer of the SiN$_x$ gap fill layer on the exposed surfaces of a substrate, such as the bottom and sidewalls of the trenches. The temperature of the deposition process can be in a range of about 10° C. and about 200° C. The formation process can include, for example, a deposition process including a CVD process using low RSC molecules and one or more assist gases. In some embodiments, the low RSC molecules can be a Si—N—H molecule such as, for example, TSA. In some embodiments, PHPS can be used. In some embodiments, the composition of the one or more assist gases can include, for example, ammonia, nitrogen, helium, argon, other suitable assist gas, and/or combinations thereof. In some embodiments, the CVD process can be an FCVD process. The thickness of the sub-layers can be in a range of about 1 nm to about 400 nm. An example of a first sub-layer of a $SiN_x$ gap fill layer can be first sub-layer $802_A$ as described with respect to FIG. 8.

At operation 1610, an in-situ treatment process is performed on a deposited gap fill layer. The deposition process can be followed by an in-situ treatment process where one or more plasma-activated assist gas can form NH—NH bonds between adjacent molecules in the deposited gap fill layer. Exemplary chemical changes of the molecular structures of a low RSC molecule and an assist gas during deposition and in-situ treatment are described with respect to FIG. 7. The temperature of the in-situ treatment process can be in a range of about 10° C. and about 200° C. An optional UV curing process can be used following the formation process to debond hydrogen bonds and remove hydrogen atoms from the deposited gap fill layers. If a UV curing process is utilized, the first sub-layer should have sufficient thickness to protect the underlying material from UV exposure. For example, the thickness of a first sub-layer should be greater than the penetration depth of UV light in the gap fill layer, in accordance with some embodiments.

At operation 1612, the deposition and treatment process can be performed multiple times to form more sub-layers until a $SiN_x$ gap fill layer having nominal thickness and quality has been formed at least in the trenches. The second or more sub-layers can have thicknesses equal or less than the thickness of the first sub-layer, in accordance with some embodiments. The sub-layers can form a $SiN_x$ gap fill layer having nominal thickness and quality. Examples of second sub-layer and the formed $SiN_x$ gap fill layer are respective second sub-layer $802_B$ and $SiN_x$ gap fill layer 802 described with reference to FIG. 10. The enhanced gap fill layer formed using the multi-step deposition and treatment process can also be used to fill gaps or trenches in FinFETs structures.

Various embodiments in accordance with this disclosure provide methods of forming a seamless and void-free $SiN_x$ gap fill layer. The $SiN_x$ gap fill layer can be formed using a multi-step deposition and in-situ treatment process. The formation process can include cycles of CVD deposition processes using low RSC molecules and a treatment process using one or more assist gas. Low RSC molecules can include Si—N—H molecules formed of, for example, PHPS or TSA. Assist gas can be formed of, for example, $NH_3$, He, Ar, $N_2$, any suitable gas, or combinations thereof. Nominal thickness and quality of the $SiN_x$ gap fill layer can be varied by at least the deposition condition, number of cycles, choices of molecules and assist gas.

In accordance with various embodiments of this disclosure, using the deposition and in-situ treatment process to form $SiN_x$ gap fill layers in semiconductor structures provides, among other things, benefits of (i) enhanced gap fill performance in high aspect ratio structures; (ii) void-free gap fill layer with no weak seams; (iii) optional planarization process due to the low RSC nature of molecules; (iv) controllable thickness of $SiN_x$ gap fill layer by varying the condition and cycles of the formation process; and (v) improved device reliability due to enhanced quality of gap fill layers.

In some embodiments, a method of forming a semiconductor structure includes forming a recess in the semiconductor structure. The recess can include sidewalls and a bottom surface. A silicon nitride gap fill layer can be deposited on the sidewalk and the bottom surface using a chemical vapor deposition (CVD) process. The CVD process can use low reactive sticking coefficient (RSC) molecules and a first group of assist gases. A treatment process can be performed on the deposited silicon nitride gap fill layer and can include exposing the deposited silicon nitride gap fill layer to a second group of assist gases.

In some embodiments, a semiconductor structure includes a substrate and a first and a second fin protruding from the substrate. The semiconductor structure also includes a gate electrode formed on the first and second fins. A gap fill layer is formed in the gate electrode and between the first and second fins. The gap fill layer can include a silicon nitride layer formed using a flowable chemical vapor deposition (FCVD) process and exposed to one or more plasma activated assist gases.

In some embodiments, a method of forming a semiconductor structure includes forming a conductive structure over a substrate and etching the conductive structure to form openings. The method also includes depositing a first sub-layer of a gap fill layer in the openings by a flowable chemical vapor deposition (FCVD) process using low reactive sticking coefficient (RSC) molecules and a first group of assist gases. The first sub-layer can be exposed to a second group of assist gases. A second sub-layer of the gap fill layer can be deposited over the first sub-layer and is formed by the FCVD process. The second sub-layer can be exposed to the second group of assist gases.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method of fabricating a semiconductor structure, the method comprising:
    forming a recess in the semiconductor structure, wherein the recess comprises sidewalls and a bottom surface;
    depositing a silicon nitride gap fill sub-layer on the sidewalls and the bottom surface using a chemical vapor deposition (CVD) process, wherein the CVD process uses low reactive sticking coefficient (RSC) molecules and a first group of assist gases;
    treating the silicon nitride gap fill sub-layer by exposing the silicon nitride gap fill sub-layer to a second group of assist gases; and
    repeating the depositing and the treating to form one or more silicon nitride gap fill sub-layers on the silicon nitride gap fill sub-layer.

2. The method of claim 1, wherein the low RSC molecules comprise trisilylamin (TSA).

3. The method of claim 1, wherein the low RSC molecules comprise perhydropolysilazane (PHPS).

4. The method of claim 1, wherein the first and second groups of assist gases comprise ammonia, nitrogen, helium, or argon.

5. The method of claim 1, wherein an aspect ratio of the recess is in a range of about 6-20.

6. The method of claim 1, wherein the treating is performed at a temperature between about 10° C. and about 200° C.

7. The method of claim 1, wherein the CVD process comprises a plasma-enhanced CVD (PECVD), an atomic laser deposition (ALD), or a plasma-enhanced ALD (PEALD).

8. The method of claim 1, wherein the CVD process comprises a flowable CVD (FCVD).

9. The method of claim 1, further comprising performing an in-situ ultraviolet (UV) curing process on the silicon nitride gap fill sub-layer using UV light.

10. The method of claim 1, wherein the silicon nitride gap fill sub-layer and the one or more silicon nitride gap fill sub-layers partially fill the recess.

11. A method of fabricating a semiconductor structure, the method comprising:
   forming a conductive structure over a substrate;
   etching the conductive structure to form openings;
   depositing a first sub-layer of a gap fill layer in the openings by a flowable chemical vapor deposition (FCVD) process using low reactive sticking coefficient (RSC) molecules and a first group of assist gases;
   exposing the first sub-layer to a second group of assist gases;
   depositing a second sub-layer of the gap fill layer over the first sub-layer, wherein the second sub-layer is formed by the FCVD process; and
   exposing the second sub-layer to the second group of assist gases.

12. The method of claim 11, wherein the low RSC molecules comprise trisilylamin (TSA).

13. The method of claim 11, wherein the low RSC molecules comprise perhydropolysilazane (PHPS).

14. The method of claim 11, wherein the gap fill layer comprises silicon nitride.

15. The method of claim 11, wherein the first and second groups of assist gases comprise ammonia, nitrogen, helium, or argon.

16. A method of fabricating a semiconductor structure, the method comprising:
   forming first and second fins on a substrate;
   forming a gate electrode on the first and second fins;
   etching the gate electrode to form an opening between the first and second fins;
   performing a flowable chemical vapor deposition (FCVD) process using low reactive sticking coefficient (RSC) molecules and a first group of assist gases to form a silicon nitride gap fill layer in the opening; and
   exposing the silicon nitride gap fill layer to a plasma-activated second group of assist gases, wherein the second group of assist gas comprises ammonia, nitrogen, helium, or argon.

17. The method of claim 16, wherein the low RSC molecules comprise trisilylamin (TSA).

18. The method of claim 16, wherein the first group of assist gases comprises ammonia, nitrogen, helium, or argon.

19. The method of claim 16, further comprising performing an in-situ ultraviolet (UV) curing process on the silicon nitride gap fill layer using UV light.

20. The method of claim 19, wherein a thickness of the silicon nitride gap fill layer is greater than a penetration depth of the UV light into the silicon nitride gap fill layer.

* * * * *